(12) United States Patent
Howell et al.

(10) Patent No.: US 11,652,061 B2
(45) Date of Patent: May 16, 2023

(54) PACKAGE-LEVEL BACKSIDE METALLIZATION (BSM)

(71) Applicant: Intel Corporation, Santa Clara, CA (US)

(72) Inventors: Shenavia S. Howell, Chandler, AZ (US); John J. Beatty, Chandler, AZ (US); Raymond A. Krick, Gilbert, AZ (US); Suzana Prstic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 16/442,801

(22) Filed: Jun. 17, 2019

(65) Prior Publication Data

US 2020/0395307 A1 Dec. 17, 2020

(51) Int. Cl.
*H01L 23/538* (2006.01)
*H01L 23/488* (2006.01)
*H01L 21/78* (2006.01)
*H01L 23/532* (2006.01)

(52) U.S. Cl.
CPC ...... *H01L 23/5386* (2013.01); *H01L 21/7806* (2013.01); *H01L 23/488* (2013.01); *H01L 23/53242* (2013.01); *H01L 23/53257* (2013.01)

(58) Field of Classification Search
CPC ............. H01L 23/5386; H01L 21/7806; H01L 23/488; H01L 23/53242; H01L 23/53257; H01L 24/03; H01L 24/05; H01L 24/13; H01L 24/16; H01L 23/4827; H01L 24/29; H01L 24/83; H01L 23/3675; H01L 24/32; H01L 2224/04026; H01L 2224/05639; H01L 2224/05644; H01L 2224/05655; H01L 2224/05666; H01L 2224/05671; H01L 2224/05672; H01L 2224/05684; H01L 2224/13111; H01L 2224/13139; H01L 2224/13147; H01L 2224/2919; H01L 23/42; H01L 2224/16225; H01L 2224/29109; H01L 2224/32225; H01L 2224/73204; H01L 2224/73253; H01L 2224/83801; H01L 2924/1431; H01L 2924/1434; H01L 2924/16152
USPC ......................................................... 257/773
See application file for complete search history.

(56) References Cited

U.S. PATENT DOCUMENTS

| | | | | |
|---|---|---|---|---|
| 7,476,568 B2* | 1/2009 | Lu | ........................... | H01L 24/27 257/E21.054 |
| 7,554,190 B2* | 6/2009 | Macris | .................... | H01L 24/28 257/E23.101 |
| 7,915,081 B2* | 3/2011 | Tomita | ................ | H01L 23/3675 438/109 |
| 7,982,478 B2* | 7/2011 | Abazarnia | .......... | G01R 31/2874 324/754.04 |
| 9,793,239 B2* | 10/2017 | Su | ........................ | H01L 25/0652 |
| 2011/0240279 A1* | 10/2011 | Furman | ................. | H01L 23/427 428/673 |

\* cited by examiner

*Primary Examiner* — Vu A Vu
(74) *Attorney, Agent, or Firm* — Akona IP PC (57) ABSTRACT

Embodiments may relate to a microelectronic package that includes a die and a backside metallization (BSM) layer positioned on the face of the die. The BSM layer may include a feature that indicates that the BSM layer was formed on the face of the die by a masked deposition technique. Other embodiments may be described or claimed.

20 Claims, 5 Drawing Sheets

Identifying a singulated die with a face
405

Positioning a mask such that the face of the die is at least partially exposed through an opening in the mask
410

Depositing a BSM material on the face of the singulated die through the opening
415

PACKAGE-LEVEL BACKSIDE METALLIZATION (BSM)

BACKGROUND

Solder thermal interface material (STIM) may be used for products that require higher power levels because the STIM may have higher thermal conductivity. The higher thermal conductivity may allow for more efficient cooling of the components of the products. Generally, a backside metallization (BSM) layer may be used to enable the STIM to form an inter-metallic compound (IMC) joint with a die.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, BSM layers may be used to enable a STIM layer to form an IMC joint between a die and integrated heat sink (IHS). In legacy techniques, the BSM layer may be applied at the wafer-level. However, there may be limitations to this application. Namely, once BSM is in place the more expensive STIM may be required to be used for all products that use elements of that wafer, and so flexibility in downstream manufacturing may be reduced. Also, it may be difficult to sputter singulated external silicon or wafers post-thinning due to additional process steps which may be needed. The additional process steps may include sending the die back to a supplier for testing after the sputtering of the BSM layers, sending the die to a fabrication plant for the sputtering itself, etc.

Embodiments herein relate to a package-level BSM technique in which the BSM layer may be applied to the die at the package-level rather than the wafer-level of the manufacturing process. As used herein, the term "package-level" may be used, but in other embodiments the technique may be described as "die-level" or at some other level of the manufacturing process. Application of the BSM at the package-level may enable a polymer thermal interface material (PTIM) and a STIM to be applied to chips manufactured on the same wafer. Therefore, lower power or lower average selling price (ASP) chips may be used in packages that include PTIM, whereas higher power or more reliable die may be used in packages that include STIM.

Additionally, STIM may be used in a package that includes a relatively thin die. More specifically, thinning the die subsequent to singulating the die from the wafer may provide a significant thermal improvement to the resultant package that uses the thinned die. Application of the BSM layer after the die thinning may allow STIM to be used with the thinned die, which may result in further thermal improvement of the resultant package. As used herein, "singulating" a die may refer to the technique of separating a die from a wafer.

Generally, through application of package-level BSM, the front end of the technique may not depend on the type of thermal interface material (TIM) that will ultimately be coupled with a given die or package. After a die is coupled with a substrate in a microelectronic package, which may include application of an epoxy underfill or overmold material packages that will be used in high-thermal performance applications may be masked and sputtered with BSM to facilitate STIM application.

Figure 1:
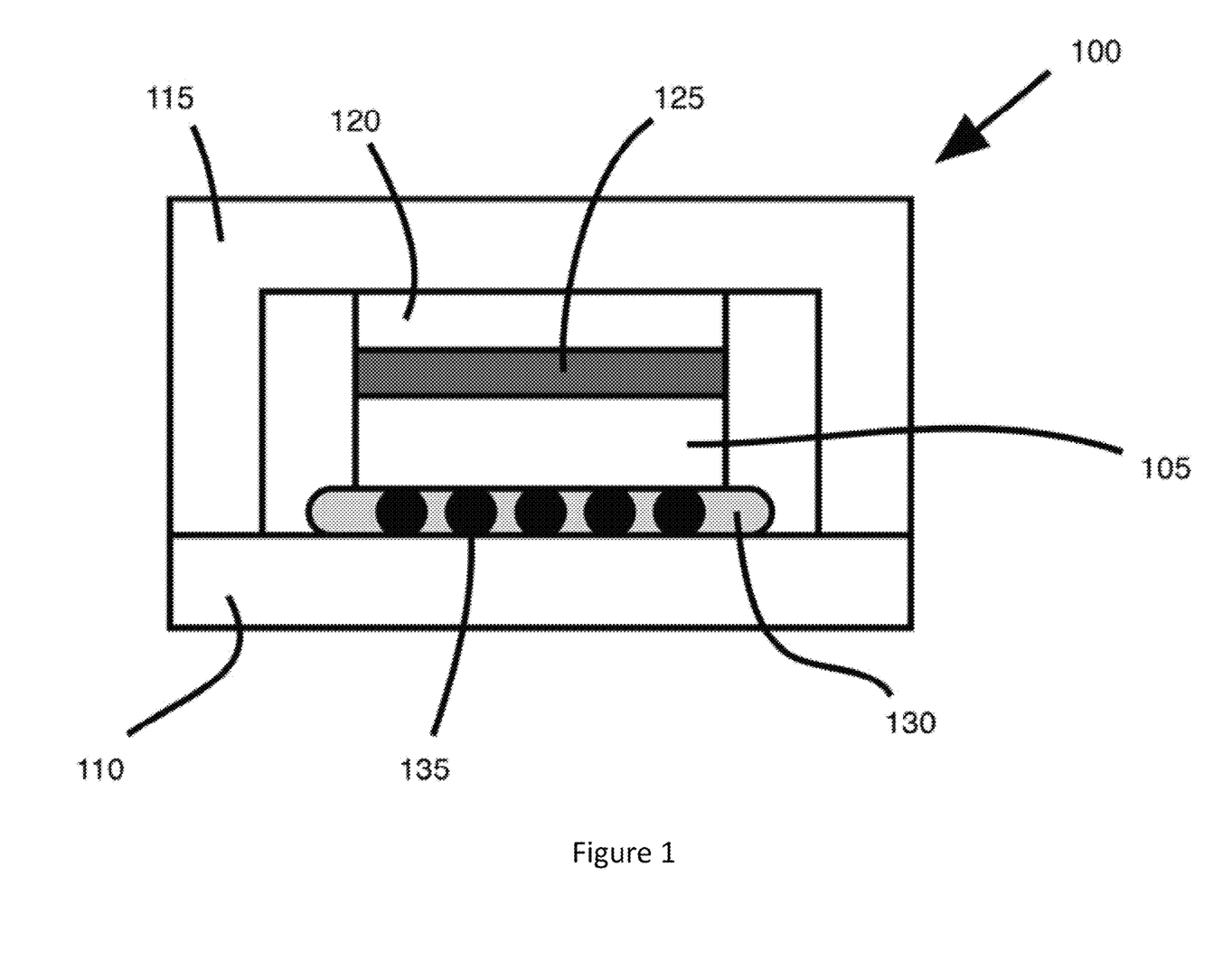
FIG. 1 depicts an example microelectronic package that includes a die with a package-level BSM layer, in accordance with various embodiments.

FIG. 1 depicts an example microelectronic package 100 that includes a die 105 with a package-level BSM layer 125, in accordance with various embodiments. The die 105 may be or include, for example, a processor such as a central processing unit (CPU), general processing unit (GPU), a core of a distributed processor, or some other type of processor. Alternatively, the die 105 may be include a memory such as a double data rate (DDR) memory, a non-volatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The die 105 may be coupled with a package substrate 110. The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. It will be understood that although the package substrate 110 is discussed herein as an element of the microelectronic package 100, in other embodiments the package substrate 110 may be considered to be an element separate from the microelectronic package 100 to which the microelectronic package 100 is coupled. For the sake of ease of description herein, the package substrate 110 will generally be discussed as an element of the microelectronic package 100 without taking a specific position on this possible difference in naming convention.

Generally, the die 105 may be coupled with the package substrate 110 by one or more interconnects 135. The interconnects 135 may be, for example, solder bumps that are formed of a material such as tin, silver, copper, etc. If solder bumps are used for the interconnects 135, then the solder bumps may be elements of a ball grid array (BGA). In other embodiments, the interconnects 135 may be pins of a pin grid array (PGA), elements of a land grid array (LGA), or some other type of interconnect. Generally, the interconnects 135 may physically or communicatively coupled the die 105 with the package substrate 110. For example, the interconnects 135 may physically couple with, and allow electrical signals to pass between, pads of the die 105 and pads of the package substrate 110 (not shown for the sake of elimination of clutter of FIG. 1).

The microelectronic package may further include an underfill material 130. The underfill material may at least partially surround the interconnects 135, and may at least partially fill the space between the die 105 and the package substrate 110. Generally, the underfill material 130 may be desirable because it may lend further structural stability to the microelectronic package 100 and strengthen the connection between the die 105 and the package substrate 110. The underfill material 130 may be formed of a material such as epoxy or some other material. As can be seen, the underfill material 130 may at least partially extend from the die footprint. That is, the underfill material 130 may at least partially extend on one or more sides from the space between the die 105 and the package substrate 110 in a direction parallel to the face of the package substrate 110 to which the die 105 is coupled (e.g., horizontally as situated in FIG. 1).

Generally, it will be understood that this depiction of the underfill material 130 and the interconnects 135 is intended as one example depiction, and other embodiments may be different than depicted. For example, although only five interconnects 135 are depicted in FIG. 1, other embodiments may have more or fewer interconnects. Additionally, although the underfill material 130 is depicted as being generally uniformly oval-shaped, in other embodiments the underfill material 130 may have a trapezoidal shape (with either a straight face or an arc-shaped face) from the die 105 to the package substrate 110 where it is narrower at a location closer to the die 105 than it is at a location closer to the package substrate 110.

The microelectronic package 100 may further include a BSM layer 125 coupled with the die 105. The BSM layer 125 may be composed of gold, silver, titanium, chromium, vanadium, tungsten, nickel, or some other material. As noted previously, the BSM layer 125 may be formed, deposited, or otherwise disposed on the die 105 at the die-level or the package-level. Specifically, after the die 105 is formed on a wafer, the die 105 may be singulated. A mask may be applied to the die 105 and the BSM layer 125 may be sputter-deposited onto the face of the die 105. In some embodiments, this sputter-deposition may occur prior to coupling the die 105 with the package substrate 110, while in other embodiments this sputter-deposition may occur subsequent to coupling the die 105 with the package substrate 110.

A STIM layer 120 may then be applied to the BSM layer 125 to facilitate a bond between a lid 115 (as will be discussed in further detail below) and the die 105. The STIM layer 120 may be composed of, for example, indium or another similar material. More specifically, post reflow, the BSM layer 125 and lid 115 may interact with the STIM layer 120 to form solder joints as described above. The IMC formed during this reflow may increase the strength of the interfaces between the different materials. Generally, the BSM layer 125 may facilitate the formation of the ICM between the STIM to form the IMC between the die 105 and the STIM layer 120, or between the STIM layer 120 and the lid 115.

A lid 115 may then be coupled with the microelectronic package 100 such that the lid 115 is in thermal or physical contact with the STIM layer 120. In some embodiments, the lid 115 may also be referred to as a heat spreader or an integrated heat spreader (IHS). Generally, the lid 115 may couple with a thermal solution such as a vapor chamber, fins, etc. to transfer heat from the microelectronic package 100 (and specifically the die 105) away from the microelectronic package 100. Thermal energy may transfer from the die 105, through the STIM 120 and into the lid 115, where it may then be transferred away from the microelectronic package 100.

Generally, it will be understood that this depiction of the microelectronic package 100 is intended as one example depiction, and other embodiments may have different features or characteristics than explicitly depicted. For example, although only five interconnects 135 are depicted in FIG. 1, other embodiments may have more or fewer interconnects. Additionally, although the underfill material 130 is depicted as being generally uniformly oval-shaped, in other embodiments the underfill material 130 may have a trapezoidal shape (with either a straight face or an arc-shaped face) from the die 105 to the package substrate 110 where it is narrower at a location closer to the die 105 than it is at a location closer to the package substrate 110. Additionally, it should be understood that the features are depicted in FIG. 1 with certain dimensions for the sake of ease of depiction. The actual sizes of various elements may be different in other embodiments, and unless explicitly noted, relative sizes of layers or elements (either laterally or vertically) should not be inferred from FIG. 1. It will also be understood that although a single die 105 is depicted, in some embodiments the microelectronic package 100 may include a plurality of die. In some embodiments, each of the plurality of dies may have a package-level BSM layer, while in other embodiments at least one of the dies may have a package-level BSM layer, and another of the dies may have a wafer-level BSM layer. Other variations may be present in other embodiments.

Figure 2:
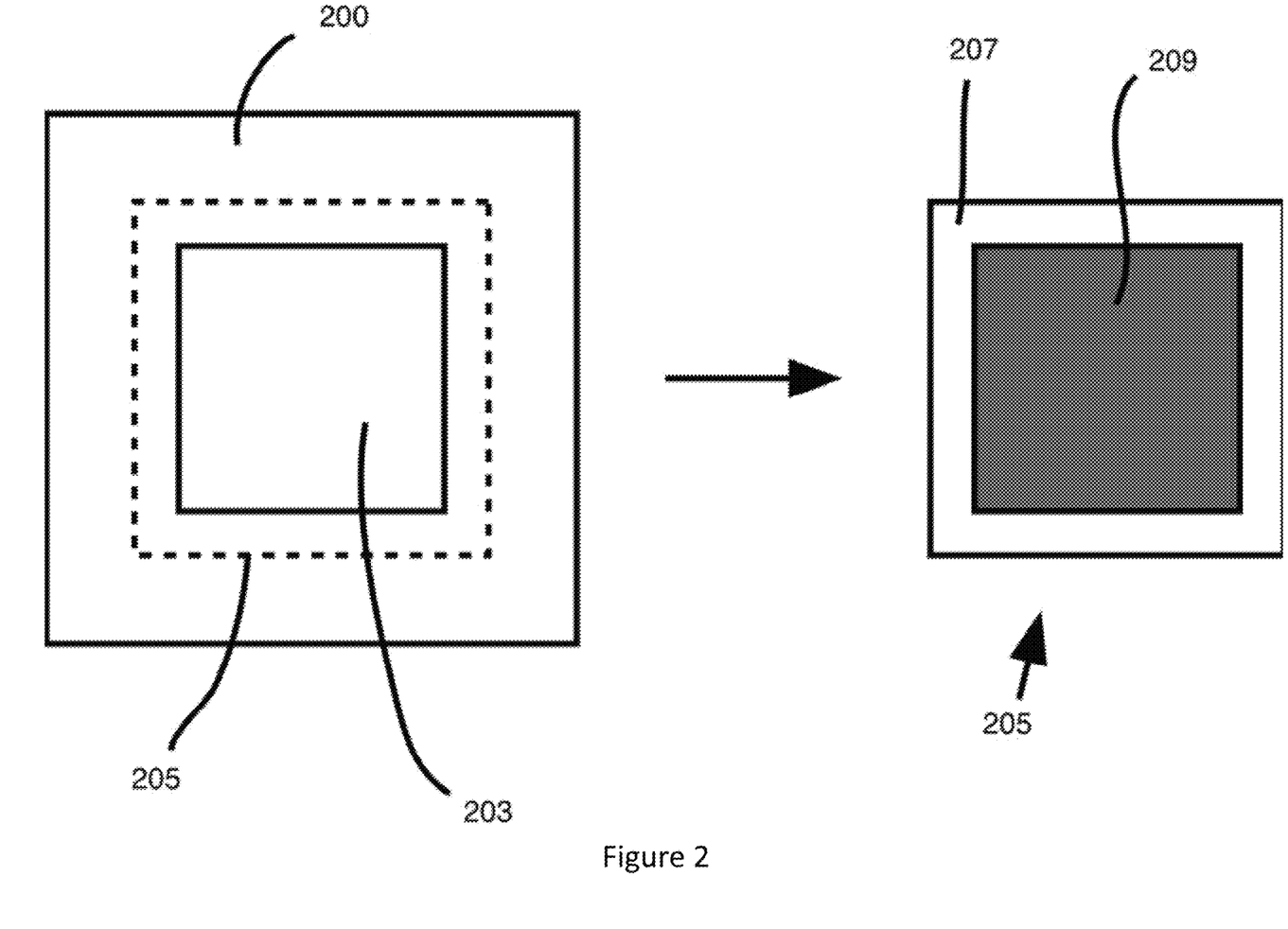
FIG. 2 depicts an example top-down view of a mask that may be used to apply a package-level BSM layer, and the resultant die, in accordance with various embodiments.

FIG. 2 depicts an example top-down view of a mask that may be used to apply a package-level BSM layer, and the resultant die, in accordance with various embodiments. The mask may be used during the sputter-deposition process to protect from application of the BSM material to other elements of a microelectronic package such as the package substrate. However, it may be difficult to make the opening in the mask have the exact same footprint or shape as the die. Therefore, in real-world embodiments the mask may be either slightly smaller than the footprint of the die, or slightly larger than the footprint of the die. FIG. 2 depicts an example wherein the opening of the mask is slightly smaller than the footprint of the die. Specifically, the left side of FIG. 2 may depict the application of the mask to the die, and the right side of FIG. 2 may depict the die after deposition of the BSM material through the mask and removal of the mask.

As can be seen on the left side of FIG. 2, the mask 200 may include an opening 203 through which the BSM material may be deposited on a face of a die 205. The die 205 may be similar to, and share one or more characteristics of, die 105. The dashed line may indicate the footprint of the die 205, and as can be seen the size of the opening 203 may be smaller than the footprint of the die 205.

As a result, when the mask 200 is removed subsequent to sputter-deposition of the BSM material, the die 205 may include a portion 209 that includes a BSM layer similar to BSM layer 125. The die 205 may also include a portion 207 at the periphery of the face where the BSM material is not present. This portion 207 may be due to the opening 203 being smaller than the face of the die 205 as described above.

Figure 3:
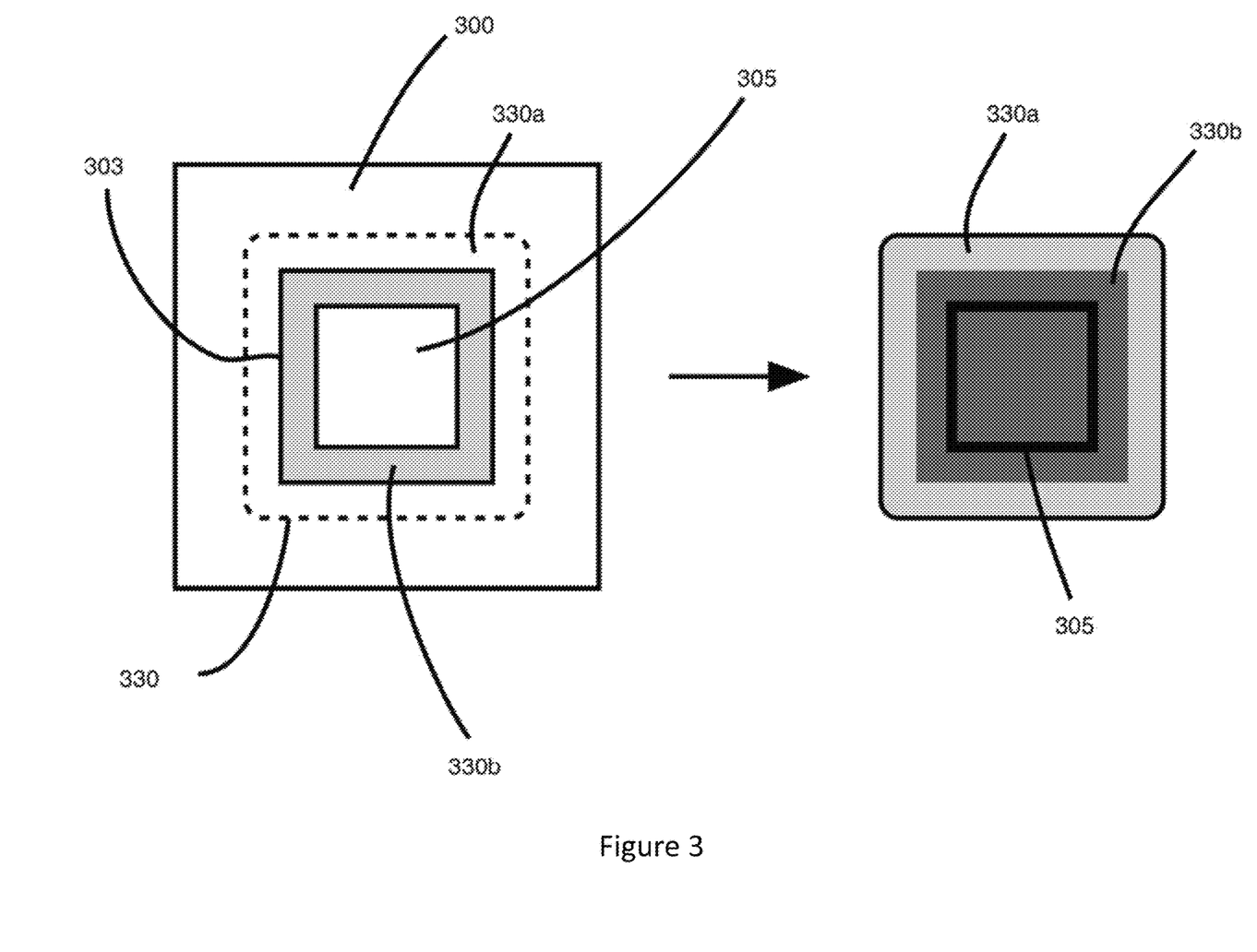
FIG. 3 depicts an alternative example top-down view of a mask hat may be used to apply a package-level BSM layer, and the resultant die, in accordance with various embodiments.

By contrast, FIG. 3 depicts an example top-down view of a mask that may be used to apply a package-level BSM layer, and the resultant die, in accordance with various embodiments. Specifically, FIG. 3 depicts an example wherein the opening of the mask is slightly larger than the footprint of the die. Similarly to FIG. 2, the left side of FIG. 3 may depict the application of the mask to the die, and the right side of FIG. 3 may depict the die after deposition of the BSM material through the mask and removal of the mask.

Specifically, a die 305 may be coupled with an underfill layer 330. The die 305 and the underfill layer 330 may be respectively similar to, and share one or more characteristics of, die 105 and underfill layer 130. A mask 300, which may be similar to, and share one or more characteristics of, mask 200 may be placed over the die 305. The mask 300 may include an opening 303 through which the die 305 may be exposed. Additionally, a portion 330b of the underfill layer 330 may be exposed in the opening 303. Another portion 330a of the underfill layer 330 may be covered by the mask 300.

When the BSM material is sputter-deposited onto the mask 300, die 305, and portion 330b of the underfill layer 330, the mask 300 may be removed as shown on the right side of FIG. 3. As can be seen, the die 305 and the portion 330b of the underfill layer 330 that were exposed through the opening 303 may include a layer of the BSM material (as indicated by the darker shaded portion). The portion 330a of the underfill layer 330 that was protected by the mask may not include the layer of the BSM material.

It will be understood that FIGS. 2 and 3 are intended as highly simplified and non-exhausted examples of how sputter-deposition may be achieved using a mask. For example, extraneous elements such as the package substrate may not be depicted in FIG. 2 or 3. In some embodiments, the opening 303 in the mask 300 may be so large that at least a portion of the package substrate (e.g., package substrate 110) may be exposed and therefore the BSM material may be deposited on a portion of the package substrate. In some embodiments the opening may not be exactly square or lined up with the face of the die as depicted, but rather may be tilted or shifted to one side or another of the die. In some embodiments the opening may have a shape different than that of the die. Other variations may be present in other embodiments.

The mask such as masks 200 or 300 may be made of a variety of materials. For example, in some embodiments the mask may be a pre-formed piece of a rigid material such as metal, plastic, or some other material. In this embodiment, the mask may have one or more openings through which a die may be exposed, and the mask may be positioned such that the die is at least partially exposed within the opening prior to the sputter-deposition of the BSM material. In some embodiments, the mask may be held in place by a clamp mechanism, a socket mechanism or some other mechanism which may be used to hold the mask in place relative to the die. For example, if the BSM material is being sputter-deposited at the package-level, then a clamp may be coupled to both the package substrate and the mask to hold the mask in place relative to the package substrate and the die. Other mechanisms of holding the mask in place may be present in other embodiments.

In other embodiments, the mask may be formed of a tape material such as a high-temperature tape that is rated to withstand the sputtering temperature and remain stable across a range of temperatures and in a plasma environment. (An example of such a high-temperature tape may be a polyimide film. Similarly to the metal mask, the tape may be placed such that it forms an opening through which the face of the die is at least partially exposed prior to the sputter-deposition. Specifically, in some embodiments a die or a package substrate may be coupled with a first layer of tape which may hold the die or package substrate in place. A second layer of tape may be placed fully over the face of the die, and then cut via a laser, a physical apparatus, or some other element such that the tape is at least partially removed from the face of the die. The BSM material may then be sputter-deposited onto the face of the die. Other materials may be used in other embodiments.

Generally, embodiments above have been described with respect to a mask with a single opening. However, it will be understood that in some embodiments a mask may have a plurality of openings, and respective dies may be positioned in respective openings of the plurality of openings. For example, if a metal mask is used, the mask itself may be circular, rectangular, etc. and include a plurality of openings such as openings 203 or 303. A plurality of dies, or a plurality of package substrates with dies attached, may be positioned such that the faces of the dies are at least partially exposed within the openings. The BSM material may then be sputter-deposited on the plurality of dies, and the mask may be removed.

Similarly, if a high-temperature tape mask is used as described above, then a plurality of dies (or package substrates that includes dies) may be coupled with a first layer of the tape so that the tape can hold the dies in position. The second layer of tape may be deposited over the faces of the dies and then optically or mechanically etched as described above to at least partially expose the faces of the dies. The BSM material may be sputter-deposited onto the faces of the dies, and then one or both layers of the tape may be removed from the dies.

Similarly to above, it will be understood that these described techniques are one example of various techniques related to using a mask to sputter-deposit a BSM material onto the face of a die at a package-level or die-level. Other variations may be present in other embodiments.

Figure 4:
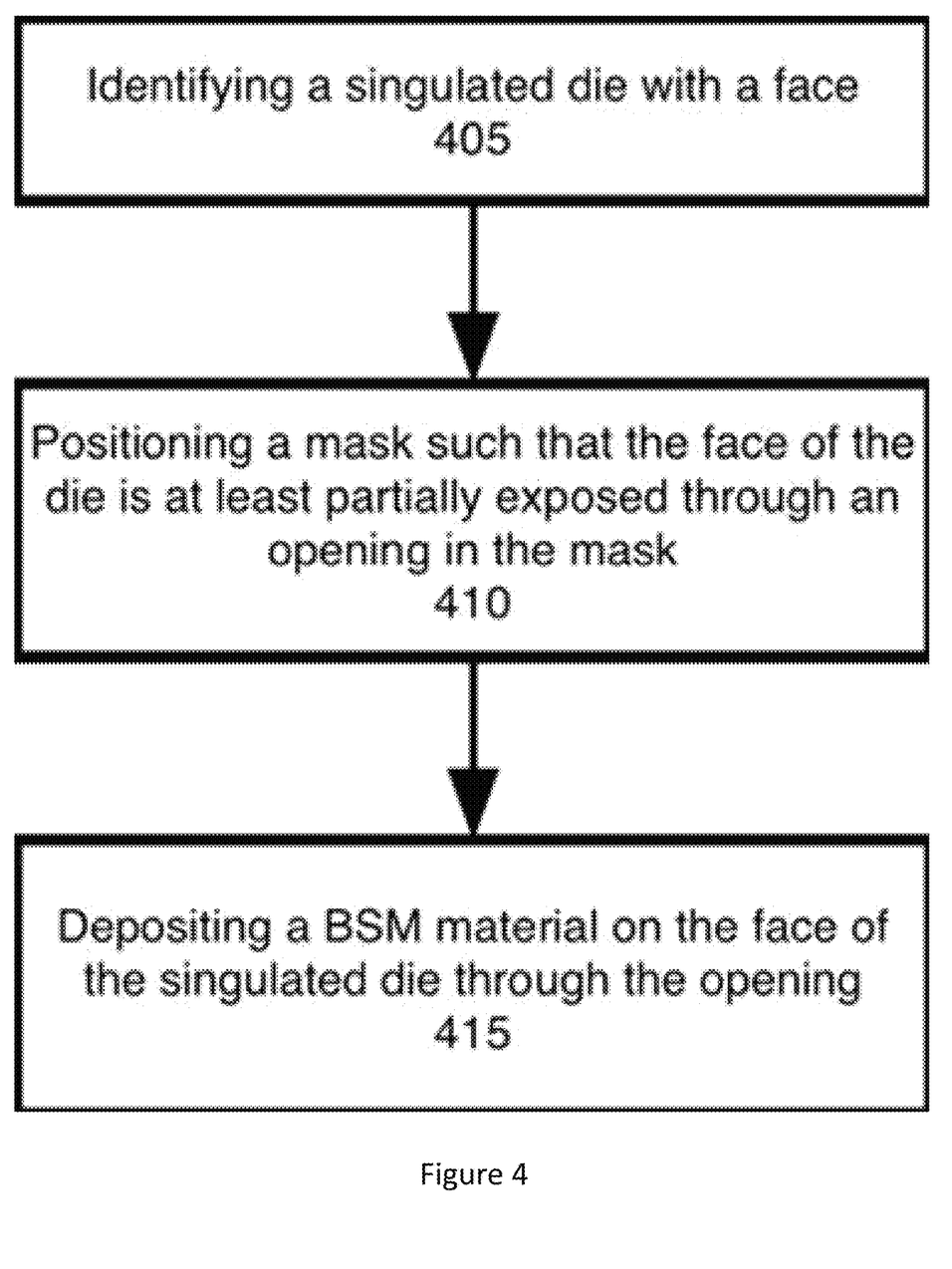
FIG. 4 depicts an example technique that may be used to generate a package-level BSM layer, in accordance with various embodiments.

FIG. 4 depicts an example technique that may be used to generate a package-level BSM layer, in accordance with various embodiments. It will be understood that this technique is intended as an example, and other embodiments may have more or fewer elements, elements in a different order, etc.

The technique may include identifying, at 405, a singulated die with a face. The die may be similar to, and share one or more characteristics of, dies 105, 205, or 305. In some embodiments the die may be coupled with a package substrate. In other embodiments the die may be coupled with a carrier tape, a carrier layer, or some other element that may be used during a die manufacturing process.

The technique may further include positioning, at 410, a mask such that the face of the die is at least partially exposed through an opening in the mask. The mask may be similar to, and share one or more characteristics of, masks 200 or 300 described above or some other mask discussed herein. The opening may be similar to, for example, openings 203 or 303.

The technique may further include depositing, at 415, a BSM material on the face of the singulated die through the opening. For example, the BSM material may be sputter-deposited on the face of the die through the opening in the mask as described above. The mask may then be removed.

Figure 5:
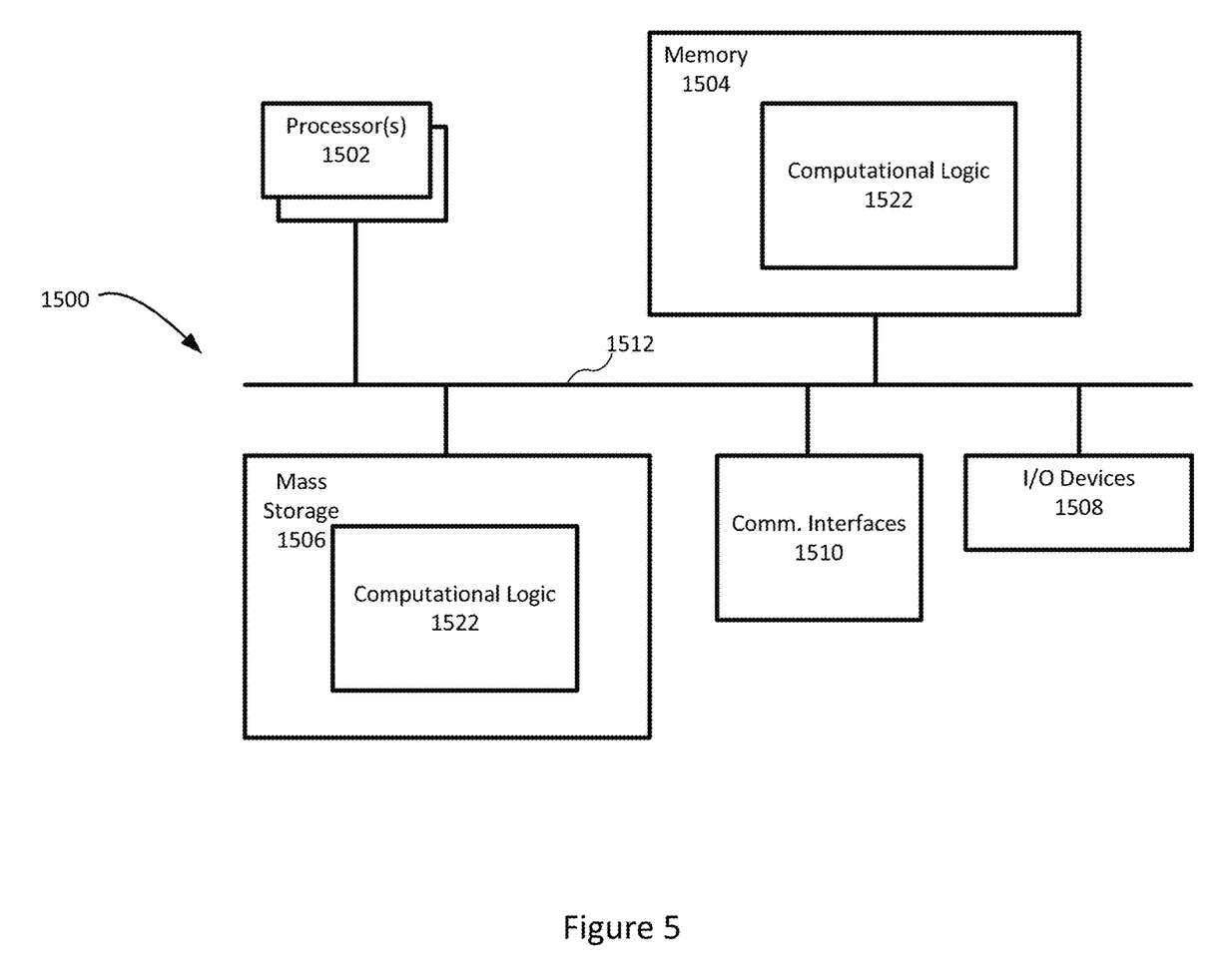
FIG. 5 illustrates an example device that may use various embodiments herein, in accordance with various embodiments.

FIG. 5 illustrates an example computing device 1500 suitable for use with microelectronic package 100, in accordance with various embodiments. Specifically, in some embodiments, the computing device 1500 may include one or more of microelectronic package 100 with a package-level BSM layer therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable ROM, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of microelectronic packages 100. For example, in some embodiments the processor 1502, memory 1504, or some other component of the computing device 1500 may be a die such as die 105.

EXAMPLES OF VARIOUS EMBODIMENTS

Example 1 includes a microelectronic package comprising: a substrate; a die coupled to the substrate at a first face of the die; a backside metallization (BSM) layer on a second face of the die, wherein the second face is opposite the first face; and a solder thermal interface material (STIM) coupled with the BSM layer; wherein the BSM layer includes a feature that is: bleed over of the BSM layer beyond a periphery of the die; or a portion of the second face of the die at a periphery of the die that does not include the BSM layer.

Example 2 includes the microelectronic package of example 1, wherein the STIM includes indium.

Example 3 includes the microelectronic package of example 1, wherein the BSM layer includes gold, silver, or nickel.

Example 4 includes the microelectronic package of any of examples 1-3, further comprising a thermal solution coupled with the STIM such that the STIM is between the die and the thermal solution; and wherein the STIM is to facilitate transfer of thermal energy from the die to the thermal solution.

Example 5 includes the microelectronic package of any of examples 1-3, wherein if the BSM layer bleeds over beyond the periphery of the die, then a portion of the BSM layer is present on a fillet of an underfill material that is used to underfill a space between the die and the substrate.

Example 6 includes a microelectronic package comprising: a die with a face; and a backside metallization (BSM) layer positioned on the face of the die; and wherein the BSM layer includes a feature that indicates that the BSM layer was formed on the face of the die by a masked deposition technique.

Example 7 includes the microelectronic package of example 6, wherein the feature includes a portion of the face around a periphery of the face that does not include the BSM layer.

Example 8 includes the microelectronic package of example 6, wherein the feature includes a portion of the BSM layer on a support to which the die is coupled.

Example 9 includes the microelectronic package of example 6, wherein the feature includes a portion of the BSM layer on a fillet that is physically coupled with the die.

Example 10 includes the microelectronic package of any of examples 6-9, wherein the BSM layer is coupled with a solder thermal interface material (STIM) that includes indium.

Example 11 includes the microelectronic package of any of examples 6-9, wherein the BSM layer includes gold, silver, or nickel.

Example 12 includes the microelectronic package of any of examples 6-9, wherein the die is a first die, and wherein the microelectronic package further comprises a second die with a BSM layer positioned on a face of the second die, and wherein the BSM layer on the face of the second die is absent the feature that indicates that the BSM layer was formed on the face of the second die by a masked deposition technique.

Example 13 includes a method of forming a microelectronic package, the method comprising: identifying a singulated die with a face; positioning a mask such that the face of the singulated die is at least partially exposed through an opening in the mask; and depositing a backside metallization (BSM) material on the face of the singulated die through the opening.

Example 14 includes the method of example 13, where the BSM material includes gold, silver, or nickel.

Example 15 includes the method of examples 13 or 14, further comprising positioning a solder thermal interface material (STIM) on the BSM master.

Example 16 includes the method of example 15, further comprising coupling a thermal solution to the STIM such that the die is thermally coupled with the thermal solution by the STIM.

Example 17 includes the method of examples 13 or 14, wherein the singulated die is a first singulated die and the opening is a first opening, and wherein the method further comprises: identifying a second singulated die with a face; positioning the mask such that the face of the second singulated die is at least partially exposed through the second opening; and depositing the BSM material on the face of the second singulated die through the second opening.

Example 18 includes the method of example 17, wherein the depositing the BSM material on the face of the second singulated die is performed concurrently with the depositing of the BSM material on the face of the first singulated die.

Example 19 includes the method of examples 13 or 14, wherein the face of the singulated die is fully exposed in the opening.

Example 20 includes the method of examples 13 or 14, wherein the face of the singulated die is partially covered by the mask when the mask is positioned such that the face of the singulated die is at least partially exposed through the opening.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
    a substrate;
    a die coupled to the substrate at a first face of the die;
    a backside metallization (BSM) layer on a second face of the die, wherein the second face is opposite the first face, and wherein the BSM layer is a blanket layer of a BSM material; and
    a solder thermal interface material (STIM) coupled with the BSM layer and having a portion in direct contact with the BSM layer;
    wherein a portion of the second face of the die at a periphery of the die does not include the BSM layer and wherein the BSM layer is between the second face of the die and the STIM.

2. The microelectronic package of claim 1, wherein the STIM includes indium.

3. The microelectronic package of claim 1, wherein the BSM layer includes gold, silver, or nickel.

4. The microelectronic package of claim 1, further comprising a thermal solution coupled with the STIM such that the STIM is between the die and the thermal solution; and wherein the STIM is to facilitate transfer of thermal energy from the die to the thermal solution.

5. The microelectronic package of claim 1, wherein the blanket layer of the BSM material covers most of the second face of the die.

6. The microelectronic package of claim 1, wherein the blanket layer of the BSM material is electrically disconnected from all power contacts and ground contacts of the microelectronic package.

7. The microelectronic package of claim 1, further comprising a lid, wherein the STIM separates the BSM layer from the lid.

8. The microelectronic package of claim 1, wherein a portion of the STIM is in contact with the portion of the second face of the die at the periphery of the die.

9. The microelectronic package of claim 1, wherein the BSM layer is in contact with the second face of the die.

10. A method of forming a microelectronic package, the method comprising:
    identifying a singulated die with a face;
    positioning a mask such that the face of the singulated die is at least partially exposed through an opening in the mask; and
    depositing a backside metallization (BSM) material on the face of the singulated die through the opening,
    wherein the face of the singulated die is partially covered by the mask when the mask is positioned such that the face of the singulated die is at least partially exposed through the opening.

11. The method of claim 10, where the BSM material includes gold, silver, or nickel.

12. The method of claim 10, further comprising positioning a solder thermal interface material (STIM) on the BSM master.

13. The method of claim 10, wherein the face of the singulated die is fully exposed in the opening.

14. A microelectronic package comprising:
    a substrate;
    a die coupled to the substrate at a first face of the die;
    a backside metallization (BSM) layer on a second face of the die, wherein the second face is opposite the first face, the BSM layer is a blanket layer of a BSM material, and a portion of the BSM layer extends beyond a periphery of the die;
    a solder thermal interface material (STIM) coupled with the BSM layer and having a portion in direct contact with the BSM layer; and
    a lid, wherein the STIM separates the BSM layer from the lid.

15. The microelectronic package of claim 14, wherein the blanket layer of the BSM material covers all of the second face of the die.

16. The microelectronic package of claim 14, wherein the blanket layer of the BSM material is electrically disconnected from all power contacts and ground contacts of the microelectronic package.

17. The microelectronic package of claim 14, wherein the BSM layer is between the second face of the die and the STIM.

18. The microelectronic package of claim 14, further comprising an underfill material between the die and the substrate, a part of the portion of the BSM layer that extends beyond the periphery of the die is in contact with a portion of the underfill material that extends beyond a periphery of the die.

19. The microelectronic package of claim 14, further comprising a thermal solution, wherein the STIM is between the die and the thermal solution.

20. The microelectronic package of claim 14, wherein the BSM layer is in contact with the second face of the die.

\* \* \* \* \*